United States Patent
Higashiki et al.

[11] Patent Number: 6,008,880
[45] Date of Patent: Dec. 28, 1999

[54] EXPOSURE TOOL AND METHOD CAPABLE OF CORRECTING HIGH (N-TH) ORDER LIGHT EXPOSURE ERRORS DEPENDING UPON AN INTERFIELD COORDINATE

[75] Inventors: Tatsuhiko Higashiki, Fujisawa; Keita Asanuma, Yokohama, both of Japan

[73] Assignee: Kabushiki Kaisha Toshiba, Kawasaki, Japan

[21] Appl. No.: 08/821,447

[22] Filed: Mar. 21, 1997

[30] Foreign Application Priority Data

Mar. 22, 1996 [JP] Japan .................................. 8-066439

[51] Int. Cl.[6] .......................... G01B 11/26; G03B 27/42
[52] U.S. Cl. .............................. 355/53; 356/399; 356/401
[58] Field of Search .............................. 355/53; 356/399, 356/400, 401, 363; 250/491.1

[56] References Cited

U.S. PATENT DOCUMENTS

| | | | |
|---|---|---|---|
| 5,194,893 | 3/1993 | Nishi | 355/53 |
| 5,498,501 | 3/1996 | Shimoda et al. | 355/53 |
| 5,563,708 | 10/1996 | Nakai | 356/400 |
| 5,734,462 | 3/1998 | Sakai | 355/53 |
| 5,805,866 | 9/1998 | Magome et al. | 355/53 |
| 5,808,910 | 9/1998 | Irie et al. | 356/401 |
| 5,835,196 | 11/1998 | Jackson | 355/53 |

*Primary Examiner*—Alan A. Mathews
*Attorney, Agent, or Firm*—Finnegan, Henderson, Farabow, Garrett & Dunner L.L.P.

[57] ABSTRACT

A light exposure tool of the present invention is so structured as to enable the correction of a linear intrafield error of a shot and of a higher-order intrafield error of the shot depending upon an interfield of a wafer. The light exposure tool comprises a reticle having a written circuit pattern, a reticle stage having the reticle placed on it, a reticle XY stage drive controller, a reticle stage position measuring mechanism, a wafer stage having a semiconductor wafer placed on it, the semiconductor wafer having a plurality of alignment marks formed on it for position identification, a wafer XY stage drive controller, a wafer stage position measuring mechanism, a projection optical mechanism for projecting the circuit pattern of the reticle onto the wafer to create a shot, an alignment mechanism for detecting positions of the alignment marks 9 and setting the reticle and wafer in a desired position, a calculation device, a shot rotation adjusting controller, and an isotropic magnification controller. At a time of light exposures by the projection optical mechanism on the wafer, a per-exposure systematic error of at least one of a rotation error, magnification error and skew error is approximated with an n-th order function Ls (x, y) in an interfield coordinate (x, y) of the wafer to control the alignment mechanism in accordance with the function Ls (x, y) and to correct the per-exposure systematic error depending upon the interfield coordinate of the wafer.

47 Claims, 7 Drawing Sheets

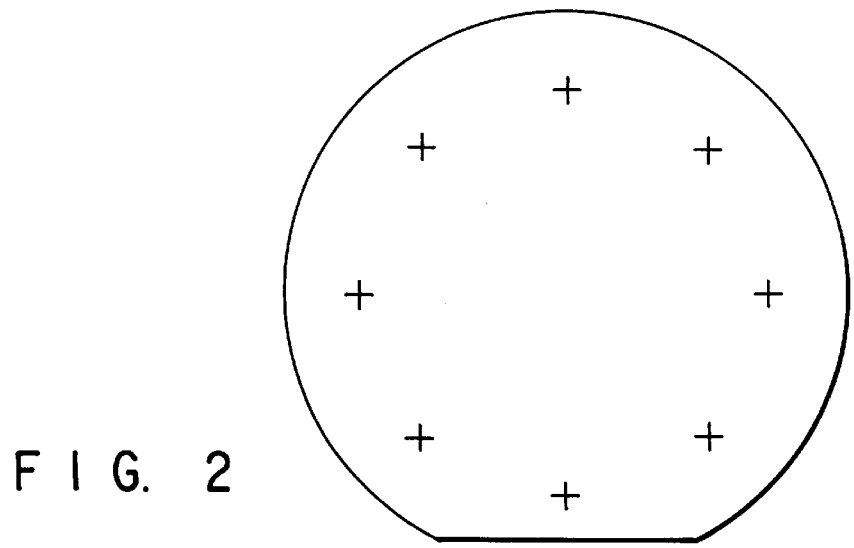
F I G. 2

$\theta s(x,y) = \theta_0 + \theta_1 x + \theta_2 y + \theta_3 x^2 + \theta_4 y^2 + \theta_5 xy + \cdots$ $My(x,y) \quad My = My_0 + My_1 x + My_2 y + My_3 x^2 + My_4 y^2 + My_5 xy + \cdots$ $Mx = Mx_0 + Mx_1 x + Mx_2 y + Mx_3 x^2 + Mx_4 y^2 + Mx_5 xy + \cdots$ $\theta so(x,y) = \theta so_0 + \theta so_1 x + \theta so_2 y + \theta so_3 x^2 + \theta so_4 y^2 + \theta so_5 xy + \cdots$

EXPOSURE TOOL AND METHOD CAPABLE OF CORRECTING HIGH (N-TH) ORDER LIGHT EXPOSURE ERRORS DEPENDING UPON AN INTERFIELD COORDINATE

BACKGROUND OF THE INVENTION

The present invention relates to an exposure tool and method for use in a process for manufacturing a semiconductor device, such as an LSI, and, in particular, to a technique for improving the overlay accuracy of a pattern projected by an optical type stepper and scanner.

Recently, with a microminiaturization of a circuit pattern of an LSI (large scale integrated circuit), an optical stepper of a high resolution type has been widely used as a pattern transfer means. When a device pattern is written on a wafer with the use of this exposure tool, it is necessary to highly accurately align a semiconductor wafer prior to being exposed with light. Upon alignment, a mark position is normally detected on a wafer. The method for detecting the position of the wafer mark is largely classified into a die-by-die system and global alignment system. The die-by-die system detects a mark position on a wafer at each chip for alignment and can achieve high overlay accuracy. The global alignment system, on the other hand, detects several alignment marks on a wafer with an alignment optical system and exposes the wafer with light by correcting a chip array from those detected mark positions. The die-by-die system can achieve high overlay accuracy, but is poor in productivity. This is the reason why the global alignment system is increasingly used.

FIG. 1 diagrammatically shows an arrangement mechanism in the conventional stepper and an alignment signal detecting system. FIG. 2 shows one practical array form of alignment marks 9 initially formed on a semiconductor wafer 4 in FIG. 1. In FIG. 1, a wafer 4 is placed on a wafer stage 5 and the wafer stage 5 can be translated by a wafer stage drive controller, not shown, in an xy direction to the wafer stage 5. A reticle having a light exposure area with a circuit pattern written thereon by an electronic beam is placed on a reticle stage 10 and the reticle stage 10 is translated by a reticle stage drive controller, not shown, in an xy direction to the reticle stage.

The alignment mechanism 1 is arranged near a projection lens 2 and illuminates the alignment marks 9 on the wafer 4, by alignment light, such as an HeNe laser 3, from an alignment light illuminating section, not shown, and allows the alignment light which is reflected/diffracted on the alignment marks 9 to be converted by a light receiving mechanism, not shown, to an electric signal and then by an alignment signal processing circuit (not shown) to position information (alignment output signal). A wafer stage laser interferometer 7 illuminates, with laser light, a mirror 7a mounted on the wafer stage 5 and measures the position of the wafer stage 5 by detecting the laser beam reflected on the mirror. A calculation device 8 calculates the alignment mark position information from the alignment mechanism 1 and wafer stage position information from the laser interferometer 7 and outputs, based on a result of calculation, a signal for controlling the position of the wafer stage 5.

Explanation will be given about the light exposure method using the light exposure tool.

Prior to exposing the wafer 4 with light, the alignment mark position is measured by the alignment optical system with the wafer 4 mounted on the wafer stage 5 and a shot array on a wafer surface is found from the alignment mark measuring position. The shot array position on the wafer surface can be separated into a linear error Lw, that is, a linear systematic error, and random error (Swx, Swy) in an interfield of the wafer.

The wafer's linear error Lw contains, as shown in FIG. 3A, a translate error ($\alpha x$, $\alpha y$) in an xy direction, rotation error (an error in a rotation direction of the wafer) $\theta w$, a scaling error (Ex, Ey), that is, an error representing an expansion/contraction error, and an orthogonality error $\theta wo$ in the interfield.

With (dxw, dyx) representing the difference between a designed mark position (x, y) and a mark position obtained by measurement, the mark detection position error on the wafer can be expressed as the functions of the coordinate (x, y) in the interfield given by $$dxw=\alpha x-(\theta w+\theta wo)\cdot y+Ex\cdot x+Swx$$
$$dyw=\alpha y+\theta w\cdot x+Ey\cdot y+Swy \quad (1)$$

where ($\alpha x$, $\alpha y$): the translate error coefficient in the xy direction;

$\theta w$: the rotation error coefficient;

(Ex, Ey): the scaling error coefficient representing the expansion/contraction of the wafer;

$\theta wo$: the orthogonality error coefficient; and (Swx, Swy): the remaining random error coefficient.

These linear error coefficients ($\alpha x$, $\alpha y$, Ex, Ey, $\theta w$, $\theta wo$) in the interfield of the wafer is found by the calculation device 8 using the least squares method.

The shot position (xw, yw) actually exposed with the light after alignment is given by the following expressions (2) with respect to a designed value (X, Y):

$$xw=X+\Delta xw$$
$$yw=Y+\Delta yw \quad (2)$$

where $\Delta xw=\alpha x-(\theta w+\theta wo)\cdot y+Ex\cdot x$ $\Delta yw=\alpha y+\theta w\cdot x+Ey\cdot y$ On the other hand, the intrafield error of the shot can be separated, as shown in FIG. 3B, into an intrafield linear error Ls (shot rotation, magnification and skew errors) and intrafield random error (Ssx, Ssy). With (dxs, dys) representing the difference between the designed mark position (Xs, Ys) and the mark position obtained by measurement, the position error in the intrafield can be expressed as the functions in the intrafield coordinate (xs, ys) which can be given by:

$$dxs=-(\theta s+\theta so)\cdot ys+Mx\cdot xs+Ssx$$
$$dys=+\theta s\cdot xs+My\cdot ys+Ssy \quad (3)$$

where (Mx, My): the magnification error coefficient representing an expansion/contraction in the shot;

$\theta s$: the shot rotation error coefficient;

$\theta so$: the shot skew error coefficient; and (Ssx, Ssy): the remaining random error coefficient.

These linear error coefficients (Mx, My, $\theta s$, $\theta so$) in the intrafield are found with the use of the least squares method.

In a stepper type light exposure tool of a step-and-repeat light exposure type, it is possible to correct the shot rotation ($\theta s$) and isotropic magnification (Mx+My)/2 of the intrafield linear errors Ls.

In the scan type light exposure tool, on the other hand, using a mercury-vapor lamp or other light sources such as an excimer laser and adapted to expose the wafer with the light by moving the wafer and reticle relative to each other while moving the wafer stage and reticle stage, it is possible to, while under the scan light exposure, correct the linear errors Ls (θs, Mx, My, θso) in the intrafield, individually.

Conventionally, the correction of the intrafield linear error Ls has been made by correcting the constant. There occurs a variation in the intrafield systematic errors, depending upon the wafer stage position, such as an error resulting from a variation in the shot rotation by a wafer stage position displacement resulting from a yawing error of the wafer stage 5 and mirror bending (distortion) of the laser interferometer 7 serving as the wafer stage position reference. The correction of such an error resulting from such a variation has not been done in the current practice. With the recent increase in the size of a wafer, such intrafield systematic error varying depending upon the position displacement of the wafer stage has reached a stage where it cannot be disregarded any longer. As set out above, such intrafield systematic error Ls has not been corrected in any conventional light exposure tool and method using the conventional optical stepper, surely presenting a near-future problem.

BRIEF SUMMARY OF THE INVENTION

It is accordingly the object of the present invention to provide an exposure tool and method which can correct intrafield systematic errors depending upon the position of a wafer stage and improve the overlay accuracy of an exposure pattern or suppress any overlay shift of a pattern from a reference position.

The object of the present invention is achieved as follows:

According to the present invention, there is provided an exposure tool comprising:

a wafer stage having a semiconductor wafer with a plurality of alignment marks formed thereon for position identification;

a wafer stage position measuring mechanism for measuring a position of the wafer stage;

a projection optical mechanism for projecting a circuit pattern onto the wafer to expose a predetermined area of the wafer with beam;

an alignment mechanism for detecting the positions of wafer in an aligned state;

a calculation mechanism for calculation-processing a signal obtained by processing an alignment output signal from the alignment mechanism and output signals obtained from the wafer stage position measuring mechanism; and a control mechanism which, at a plurality of exposures of the wafer by the projection optical mechanism, controls the alignment mechanism in accordance with an n-th order function (x, y) in an interfield coordinate (x, y) of the wafer by approximating a per-exposure systematic error of at least one of a shot rotation error, magnification error and skew error with the n-th order function Ls (x, y) and corrects the per-exposure systematic error depending upon the interfield coordinate.

According to another embodiment of the present invention, there is provided a method for writing a circuit pattern with an exposure tool for writing a circuit pattern by a beam on a semiconductor wafer placed on a wafer stage, comprising the steps of:

effecting calculation-processing by finding at least one of systematic errors Ls (θs, Mx, My, θso) at each of a plurality of shots created on the wafer and approximating at least one of a shot rotation error, magnification error and skew error with an n-th order function Ls (x, y) in an interfield coordinate (x, y) of the wafer; and effecting control by correcting at least one of a shot rotation (θs), shot magnification (Mx, My) and shot skew (θso), during the writing of the circuit pattern on the wafer, in accordance with the function Ls (x, y).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view showing one form of alignment marks on a wafer surface;

DETAILED DESCRIPTION OF THE INVENTION

Figure 4:
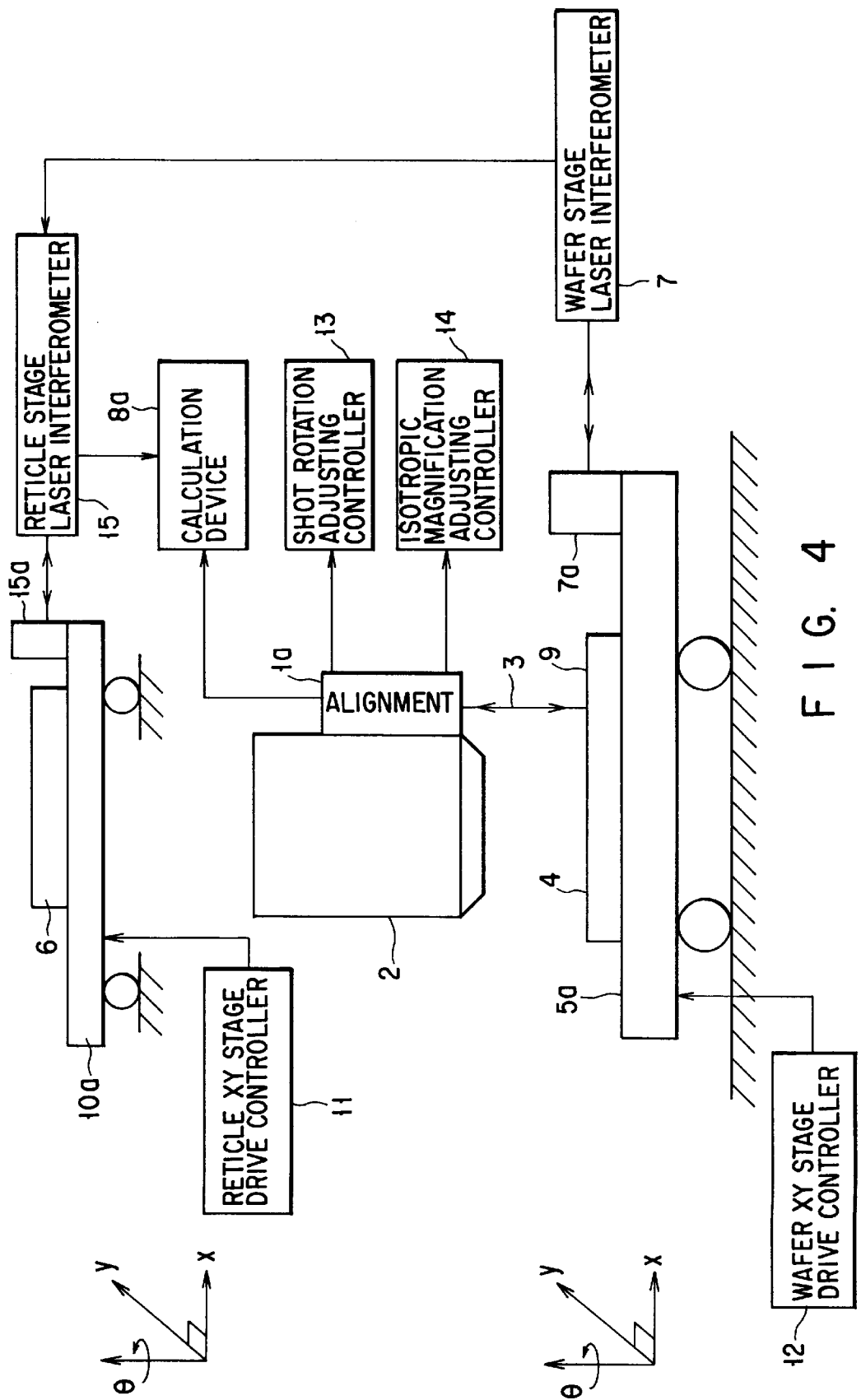
FIG. 4 is a diagrammatic view showing a stepper type light exposure tool according to a first embodiment of the present invention.

FIG. 4 schematically shows a stepper type light exposure tool according to a first embodiment of the present invention. This light exposure tool is different from the conventional stepper type light exposure tool in that it can correct not only a linear intrafield error but also a higher-order intrafield error (correct the shot rotation error in the present embodiment). That is, the light exposure tool of FIG. 4 comprises a reticle 6 with a circuit pattern written thereon, a reticle stage 10a with the reticle placed thereon, a reticle XY stage drive controller 11, a reticle stage laser interferometer 15, a wafer stage 5a having a semiconductor wafer 4 placed thereon with a plurality of position identification alignment marks 9 formed thereon, a wafer XY stage drive controller 12, a wafer stage laser interferometer 7, a projection optical device for projecting the circuit pattern of the reticle 6 on the wafer and creating a shot, an alignment mechanism 1a for detecting the positions of the position identification alignment marks 9 on the wafer 4 and for setting the reticle 6 and wafer 4 in an aligned position, a calculation device 8a, a shot rotation adjusting controller 13 and a shot rotation error correcting means.

The reticle stage 10a is movable in an xy coordinate direction in the reticle plane and in a rotation direction (θ direction) in the stage plane and the reticle XY stage drive controller 11 drives the reticle stage 10a in a translate (x, y) direction. The wafer stage 5a is movable in x, y, θ directions and the wafer XY stage drive controller 12 drives the wafer stage 5a in a translate direction. The wafer stage position measuring mechanism 7 measures the position of the wafer stage 5a in the x, y, θ directions and, as such, use is made of a wafer stage interferometer 7 and mirror 7a. The shot rotation adjusting controller 13 adjusts the θ direction position of at least one of the reticle stage 10a and wafer stage 5a. The reticle stage position measuring mechanism 15 measures the position of the reticle stage 10 in the x, y, θ directions and, as such, use is made of, for example, a reticle stage laser interferometer 15 and mirror 15a.

The projection optical device uses, for example, a mercury-vapor lamp or other optical sources, such as an excimer laser, and projects a circuit pattern of the reticle 6 on the wafer 4 by the projection lens 2 to create a shot. The alignment mechanism 1a illuminates the alignment marks 9 on the wafer with alignment light, such as a HeNe laser 3, from near the projection lens 2 and allows the alignment light which is reflected/diffracted on the alignment marks 9 to be converted by a light receiving mechanism (not shown) to an electric signal and the electric signal to be converted as an alignment output signal to position information by an alignment signal detecting circuit, not shown. The calculation device 8a calculates a signal obtained by processing the alignment output signal by means of the alignment signal detecting device (not shown) and output signals obtained from the reticle stage laser interferometer 15 and wafer stage laser interferometer 7. The shot rotation adjusting controller 13 has a stage rotation controller for driving at least one of the reticle stage 10a and wafer stage 5a in the rotation direction and has, in the present embodiment, a reticle stage rotation controller (not shown) for driving the reticle stage 10a in the rotation direction and a wafer stage rotation controller (not shown) for driving the wafer stage 5a in the rotation direction.

The shot rotation error correction means controls the shot rotation adjusting mechanism by finding the rotation error θ at each shot on the wafer 4, approximating the rotation error θ with an n-th order function θs (x, y) in the interfield coordinate (x, y) and locating the rotation position on the reticle stage in the stage plane and rotation position on the wafer stage in the stage plane in accordance with the function θs (x, y) and, in this embodiment, is provided in the alignment mechanism 1a.

The light exposure method using the light exposure tool of FIG. 4 will be explained below.

Figure 1:
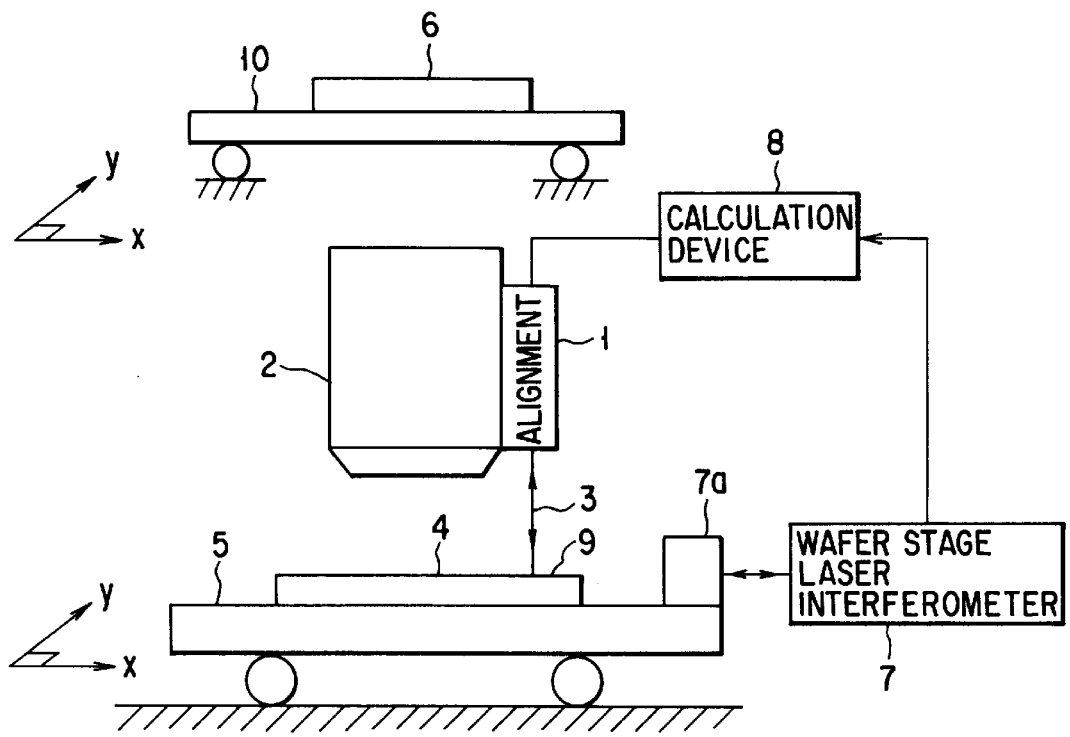
FIG. 1 is a diagrammatic view showing a conventional stepper type optical projection light exposure tool.
Figure 3A:
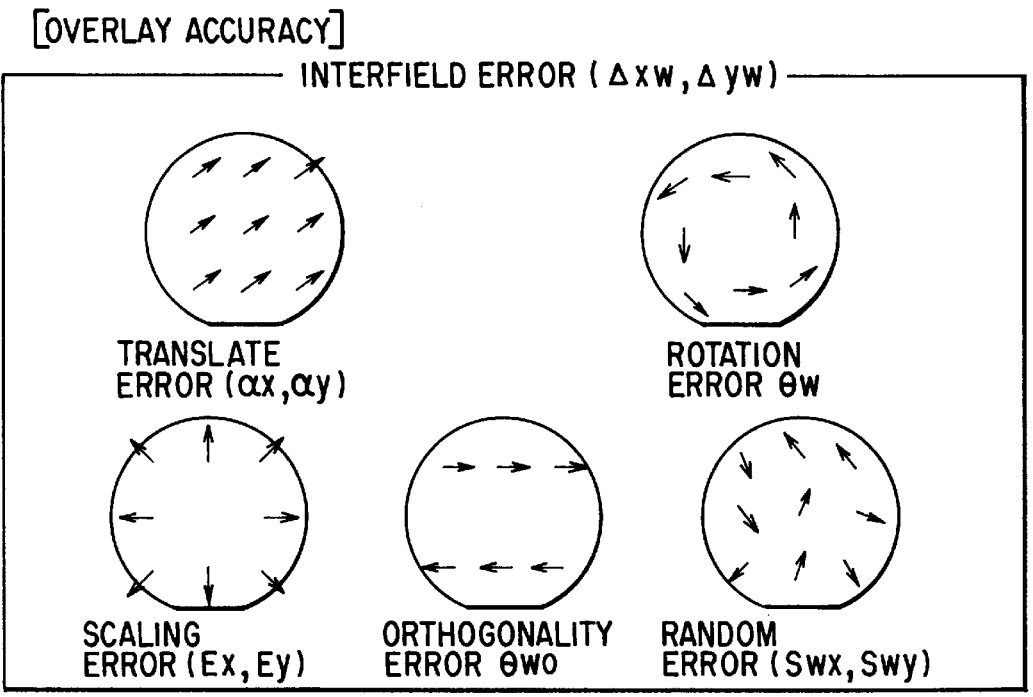
FIG. 3A is a view for explaining interfield errors classified by kind.

This light exposure method is different from the conventional stepper type light exposure tool in that not only a linear intrafield error but also a higher-order intrafield error (the shot rotation error for instance), but is similar thereto in the other respects. That is, in the same way as in the conventional light exposure method, prior to exposing the wafer 4 with the light, the position of the alignment marks 9 on the wafer 4 on the wafer stage 5a is measured by the alignment optical system to find a shot array on the wafer 4 from the alignment mark measuring position. The position of the shot array on the wafer 4 can be separated into an interfield linear error Lw of a linear systematic error and interfield random error (Sws, Swy). The interfield linear error Lw contains, as shown in FIG. 3A, a translate shift error ($\alpha x$, $\alpha y$) in the xy direction, wafer rotation direction error (rotation error) $\theta w$, scaling error (Ex, Ey), that is, an error representing an expansion/contraction of the wafer, and orthogonality error $\theta wo$, in the interfield of the wafer.

With (dxw, dyw) representing the difference between the alignment mark position (X, Y) on design and the alignment mark position obtained by measuring, the mark detection position error on the wafer 4 can be expressed as the functions of the coordinate (x, y) on the interfield of the wafer given by:

$$dxw = \alpha x - (\theta w + \theta wo) \cdot y + Ex \cdot x + Swx$$

$$dyw = \alpha y + \theta w \cdot x + Ey \cdot y + Swy \qquad (1)$$

where ($\alpha x$, $\alpha y$): the translate error coefficient in the xy direction;

$\theta w$: the rotation error coefficient;

(Ex, Ey): the scaling error coefficient representing the expansion/contraction of the wafer;

$\theta wo$: the orthogonality error coefficient; and (Swx, Swy): the remaining random error coefficient.

These interfield linear error coefficients ($\alpha x$, $\alpha y$, Ex, Ey, $\theta w$, $\theta wo$) are found by the least squares methods.

After alignment, as the actually exposed shot position (xw, yw) use is made of the coordinate position given by Equation (2) with respect to the design value (X, Y):

$$Xw = X + \Delta xw$$

$$Yw = Y + \Delta yw \qquad (2)$$

Here, the interfield errors $\Delta XW$, $\Delta YW$ are given by $$\Delta XW = \alpha x - (\theta w + \theta wo) \cdot y + Ex \cdot x$$

$$\Delta YW = \alpha y + \theta w \cdot x + Ey \cdot y$$

Figure 3B:
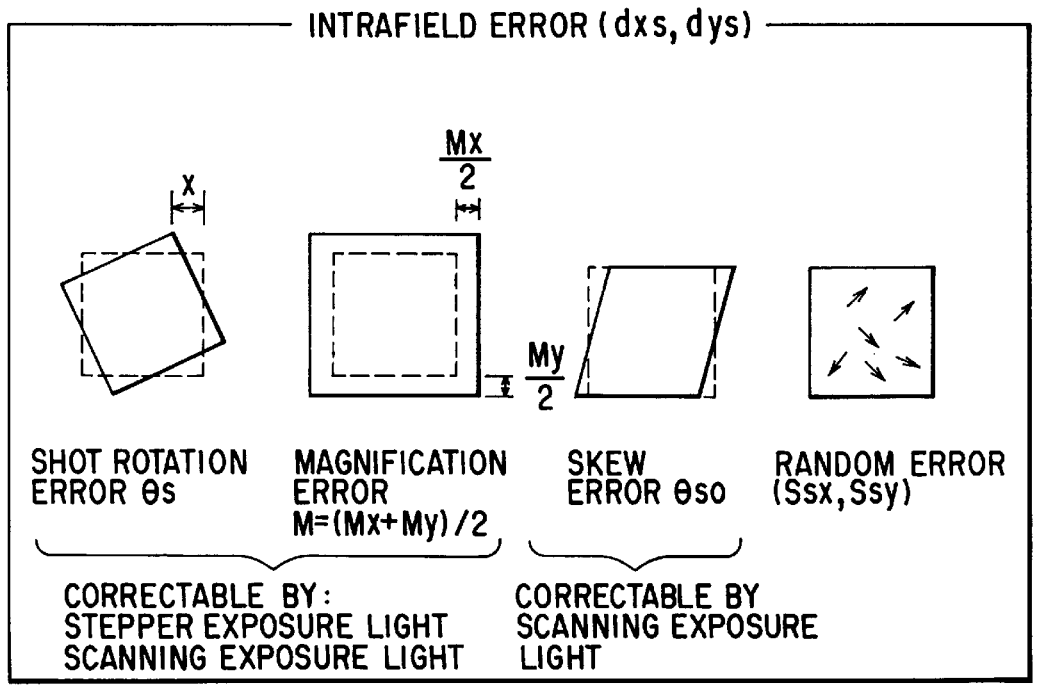
FIG. 3B is a view for explaining intrafield errors classified by kind.

On the other hand, the intrafield error can be separated, as shown in FIG. 3B, into an intrafield linear error Ls (rotation, magnification, skew) and an intrafield random error (Ssx, Ssy). In this case, when the difference between the mark position (Xs, Ys) on design and the mark position obtained by measuring is given by (dxs, dys), then the intrafield position error can be expressed as the functions of the intrafield coordinate (xs, xy) given by:

$$dxs = -(\theta s + \theta so) \cdot ys + Mx \cdot xs + Ssx$$

$$dys = +\theta s \cdot xs + My \cdot ys + Ssy \qquad (3)$$

where (Mx, My): the intrafield magnification error coefficient representing the expansion/contraction in the shot;

$\theta s$: the intrafield rotation error coefficient;

$\theta so$: the intrafield skew error coefficient; and (Ssx, Ssy): the remaining intrafield random error.

These linear intrafield error coefficients (Mx, My, $\theta s$, $\theta so$) are found with the use of the least squares method.

Out of the linear intrafield errors as set out above, the shot rotation ($\theta s$) and isotropic magnification (MX+MY)/2 can be corrected by the alignment mechanism 1a in the same way as in the conventional way.

Figure 5A:
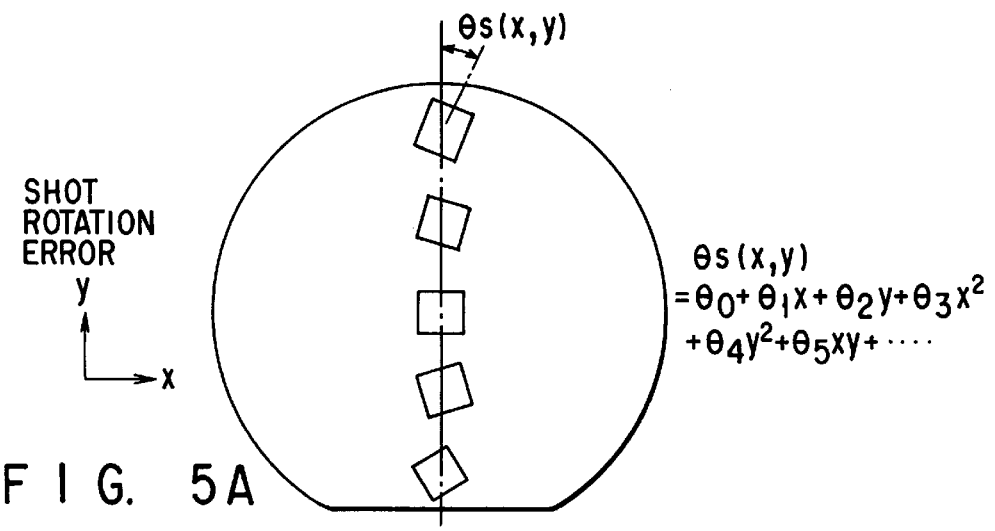
FIGS. 5A to 5C are views for explaining intrafield n-th order errors depending upon an interfield coordinate at shots created by the light exposure tool of FIG. 4.
Figure 5B:
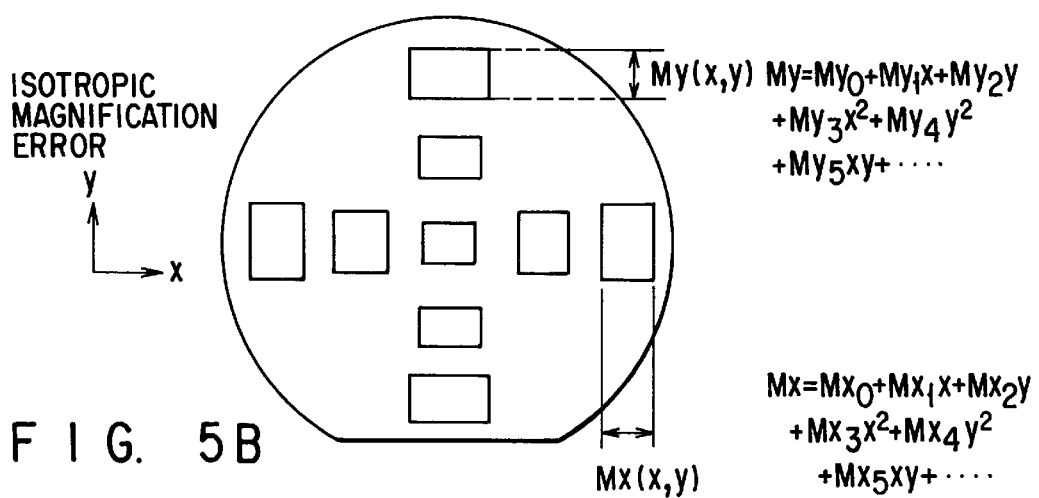
Figure 5C:
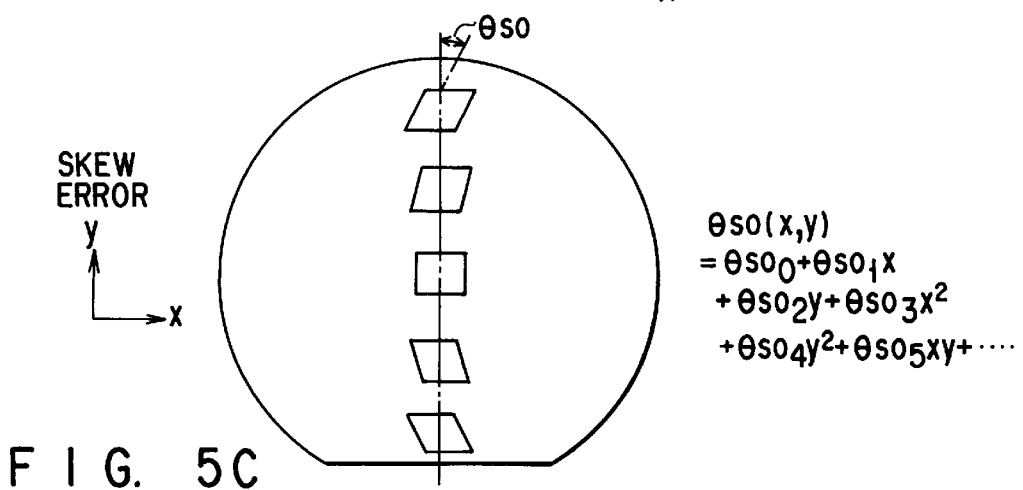

A higher-order (n-th order) intrafield error depending upon the wafer coordinate will be explained below with respect to FIGS. 5A to 5C. As shown in FIG. 3B, the shot rotation error of the interfield chip area is approximated with the n-th order function θ (x, y) of the interfield coordinate (x, y) as shown in Equation (4).

$$\theta s(x,y)=\theta s+\theta 1x+\theta 2y+\theta 3x^2+\theta 4y^2+\theta 5x\cdot y+ \quad (4)$$

Here, the first term θs of the righthand side is a shot rotation error as shown in Equation (3) and the second term, etc. (θ1, θ2, θ3, θ4, θ5, . . .) of the righthand side represent the coefficients of the respective orders of the n-th order function approximation and can be found through the least squares method, etc.

By controlling the shot rotation adjusting controller 13 in such a way as to find the rotation error θ at each shot created on the wafer, to approximate the rotation error θ with the n-th order function θs (x, y) in the interfield coordinate (x, y), that is, to find a higher-order component rotation error with the interfield coordinate of the shot rotation error used as the function, and to position both the stage in-plane rotation position of the reticle stage 10a and stage in-plane rotation position of the wafer stage 5a in accordance with the function θs (x, y), that is, by doing these, it is possible to improve an overlay accuracy, for example, between a first layer circuit pattern and a second layer circuit pattern.

Although, in the above-mentioned embodiment, the shot rotation error θ (x, y) alone has been explained as being corrected, the present invention can also be applied to the correction of the intrafield magnification error (Mx, My) alone, of both the intrafield rotation error θs (X, Y) and intrafield magnification error (Mx, My), or of the intrafield skew error θso.

That is, the intrafield magnification error Mx (x, y), My (x, y) and skew error θso (x, y) can be approximated, in the same way as in Equation (4), with an n-th order function of the interfield coordinate x, y of the wafer given by the following Equations (5) to (7):

$$Mx(x,y)=Mx0+Mx1x+Mx2y+Mx3x^2+Mx4y^2+Mx5x\cdot y+ \quad (5)$$

$$My(x,y)=My0+My1x+My2y+My3x^2+My4y^2+My5x\cdot y+ \quad (6)$$

$$\theta so(x,y)=\theta so0+\theta so1x+\theta so2y+\theta so3x^2+\theta so4y^2+ \quad (7)$$

The respective coefficients represented by the n-th order functions of the x, y coordinate in Equations (5) to (7) can be found by the least squares approximation.

By finding, for the intrafield magnification error Mx, My and skew error θso, higher-order component errors with the interfield coordinate used as the functions, it is possible to further improve the overlay accuracy of the light exposure pattern.

Explanation will be given below about the example of correcting the intrafield rotation error and magnification error depending upon the interfield coordinate x, y obtained by Equations (5) to (7). In this case, the light exposure tool of FIG. 4 further requires an isotropic magnification adjusting controller for adjusting an isotropic magnification at a shot projected on the wafer. The intrafield rotation error θ (x, y) can be corrected by controlling the intrafield rotation adjusting controller 13 in a way to correspond to the position of the interfield coordinate x, y and rotating the wafer stage 5a and reticle stage 10a (for example, varying an air pressure of the projection lens 2 in the projection optical mechanism).

Figure 6:
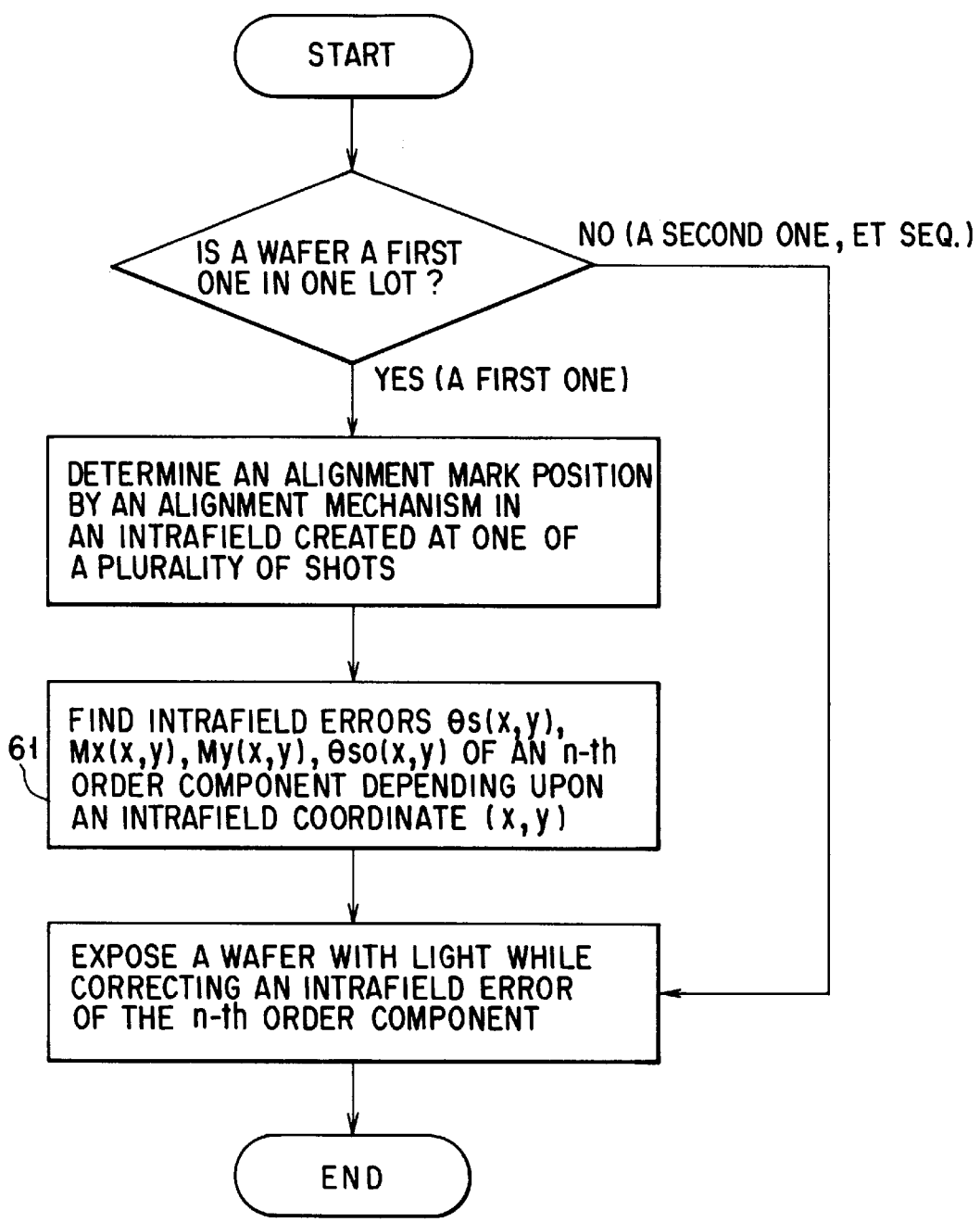
FIG. 6 is a flow chart showing an application of a light exposure method using the light exposure tool of FIG. 4.

FIG. 6 shows a flow chart about the example of applying the light exposure method using the light exposure tool of FIG. 4. In the light exposure method using the light exposure method, it is necessary to find the intrafield errors (θs(x,y), Mx(x,y), My(x,y), θso(x,y)) of the n-th order components on the interfield coordinate x, y prior to the exposure of the wafer with light. When, for example, about 25 wafers in one lot are continuously exposed in the light exposure tool, the n-th order intrafield errors are found with respect to an initially designated wafer, for example, a first wafer to be initially exposed with the light, through the measurement by the alignment mechanism of the light exposure tool, the intrafield errors are approximated with the n-th order function Ls (x, y) in the interfield coordinate (x, y) and the initially designated wafer and other wafers are sequentially exposed with the light after the reticle and wafer stage positions have been located in accordance with the function Ls (x, y).

As set out above, in the scan type light exposure tool, that is, the apparatus adapted to expose the wafer with the light of a mercury-vapor lamp or other light sources of an excimer laser, etc., while moving the wafer and reticle relative to each other by moving the reticle and wafer stages, it is possible to correct all of these intrafield linear errors Ls (θz, Mx, My, θso) under the scanning of the exposure light.

Figure 7A:
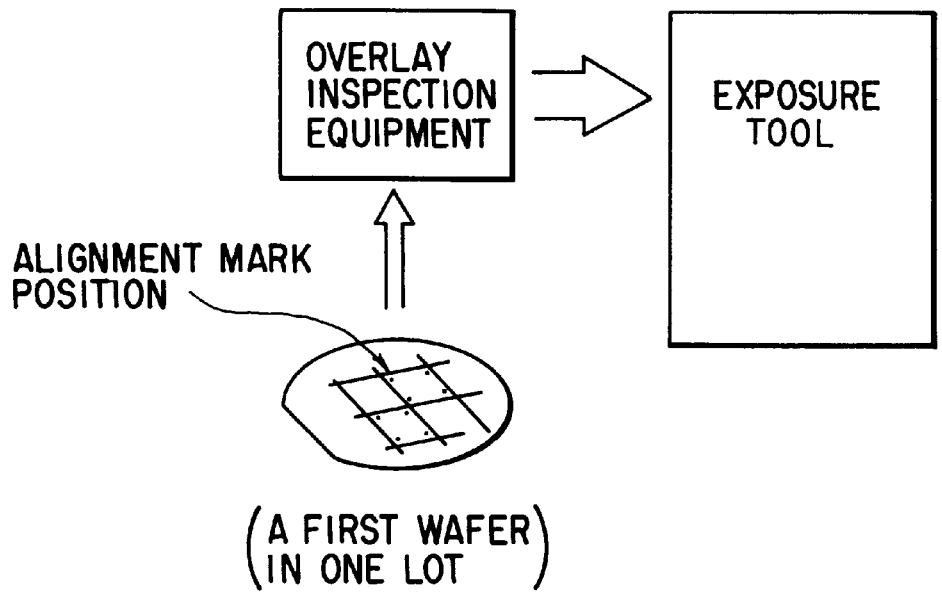
FIGS. 7A and 7B, each, are a view showing a method of applying a light exposure tool of FIG. 4.
Figure 7B:
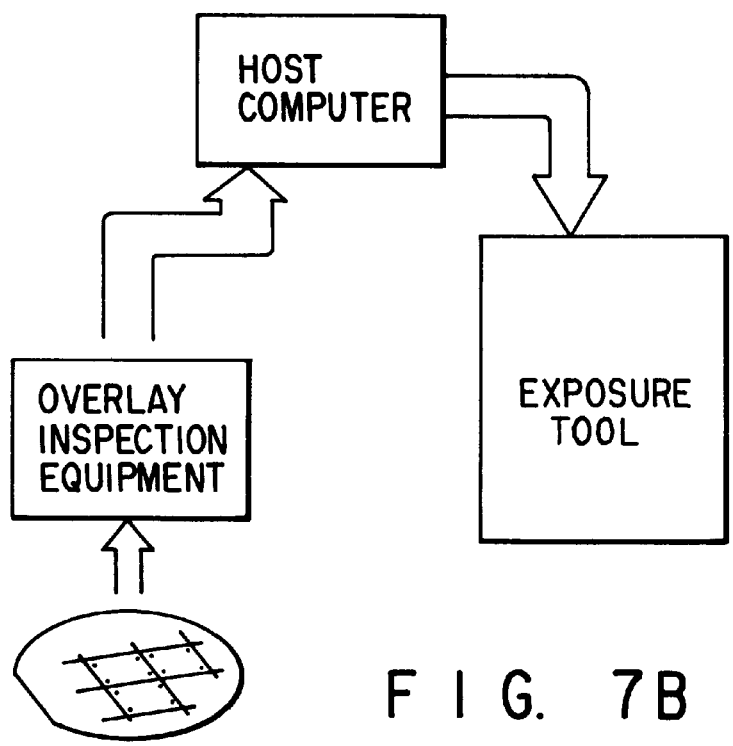

Measuring the intrafield errors depending upon the interfield coordinate in a process step 61 in FIG. 6 can be achieved by the method for calculation by the light exposure tool per se as set out above, a method for reflecting the correction of the light exposure tool by a result of calculation, such as software program, by a dedicated inspection equipment such as an apparatus having a dimension length measuring apparatus, for instance, an overlay inspection equipment, and etc. Further a still another method is by reflecting the correction of the light exposure tool by a result of calculation (for example, a software program) by a host computer after inspection has been made by the overlay inspection equipment for instance (FIGS. 7A and 7B).

Figure 8:
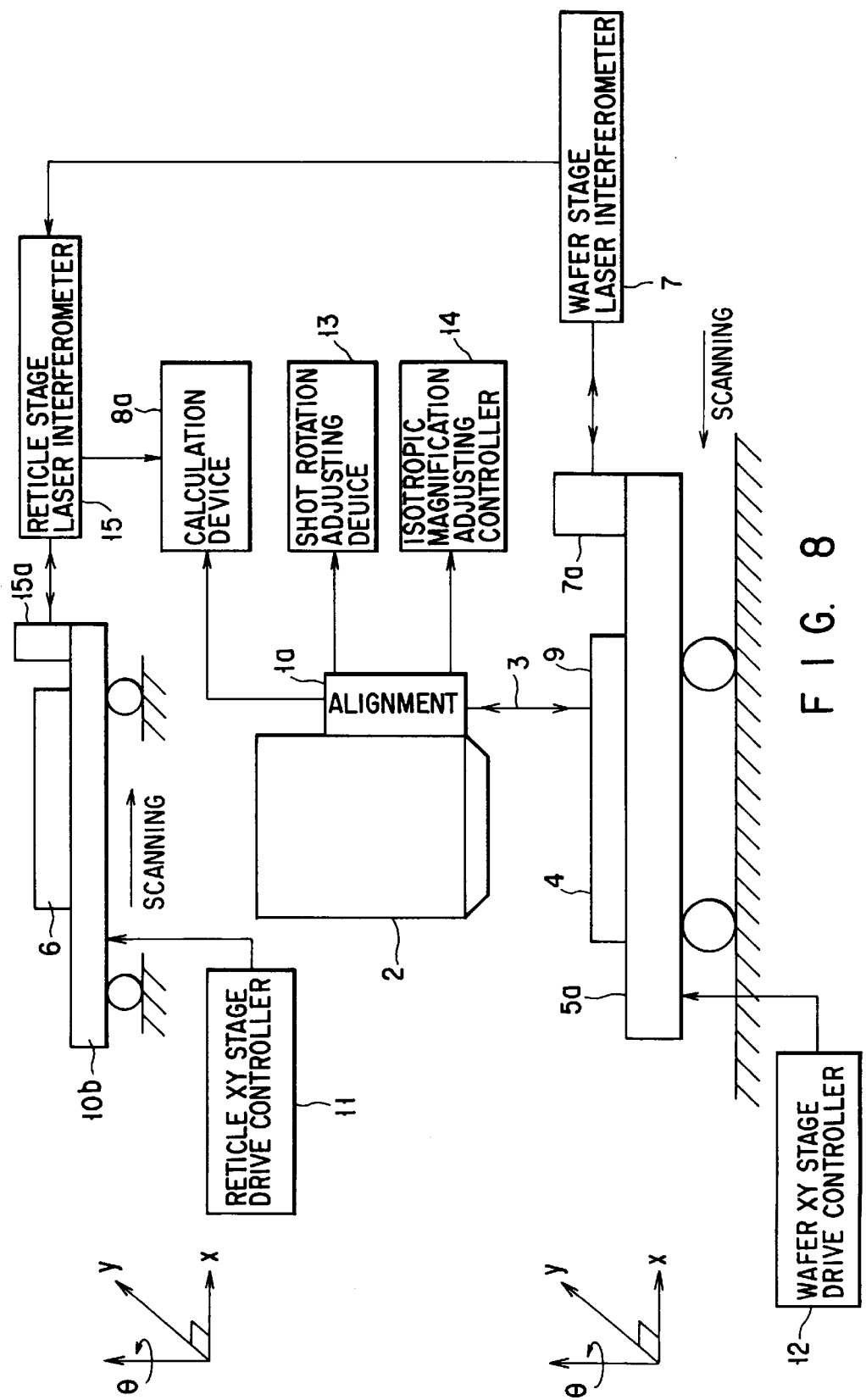
FIG. 8 is a diagrammatic view showing a scan type light exposure tool according to a second embodiment of the present invention.

FIG. 8 diagrammatically shows a scan type light exposure tool, by way of example, according to a second embodiment of the present invention. The scan type light exposure tool is the same as the stepper type exposure light apparatus of the first embodiment except in that (1) the reticle stage 10b is moved in x, y, θ, θo (skew) directions, that (2) a reticle stage laser interferometer 15 measures a reticle stage position in the x, y, θ, θo directions and that (3) the control function of a correcting means differs from that of its counterpart. The same reference numerals are employed in FIG. 8 to designate parts or elements corresponding to those shown in FIG. 4.

Using the scan type light exposure tool of FIG. 7, explanation will be given about effecting correction with respect to the intrafield rotation error, magnification error and skew error depending upon the interfield coordinate x, y obtained from Equations (4) to (7) above. The intrafield rotation error θ (x, y) can be corrected by rotating the wafer stage 5a and reticle stage 10a in accordance with the position of the interfield coordinate x, y. The measurement of the intrafield magnification Mx, My can be achieved by varying the magnification of a projection lens 2 and relative scan speeds of a wafer stage 5a and reticle stage 10a in accordance with the position of the interfield coordinate x, y. The correction of the intrafield skew θo (x, y) can be achieved by varying the relative scan speed of the wafer stage 5a and reticle stage 10a in accordance with the wafer coordinate x, y.

The present invention is characterized in that the high-order intrafield error is corrected as set out above. And no particular restriction is made only to the correction method of the light exposure tool and, for example, it is also possible to achieve this correction as will be set out below.

That is, for the correction method using the light exposure tool it may be possible to find a rotation error θ at each shot created on the wafer, to find an approximation by approximating the rotation error θ with an n-th order function θs (x, y) in the interfield coordinate (x, y), and to either correct a reticle pattern, offline, through a feedback route or correct the position of the reticle stage.

Further, the present invention can also be applied to an electronic beam exposure tool for writing a pattern with the use of an electronic beam or a mask pattern exposure tool for forming a mask pattern.

In the application of the present invention to the electronic beam exposure tool, the light exposure tool for writing a circuit pattern by an electronic beam on a semiconductor wafer on a wafer stage only needs to include a mechanism for correcting at least one of the intrafield rotation (θs), magnification (Mx, My) and skew (θso) during the writing of a pattern to the wafer and a correcting means for finding at least one of systematic errors Ls (θs, Mx, My, θso) at a plurality of shots created on the wafer, for approximating at least one of the intrafield rotation error, magnification error and skew error with an n-th order function Ls (x, y) in the interfield coordinate (x, y) and for locating the positions of the reticle stage and wafer stage in accordance with the function Ls (x, y).

In the application of the present invention to the mask pattern light exposure tool, the light exposure tool for exposing, with light, a circuit pattern on a mask on a mask stage comprises a correcting mechanism for correcting at least one of the intrafield rotation (θs), magnification (Mx, My) and skew (θso) and a correcting means for finding at least one of systematic errors (θs, Mx, My, θso) at a plurality of shots created on the mask, approximating at least one of the intrafield rotation error, magnification error and skew error with an n-th order function Ls (x, y) in a mask in-plane coordinate (x, y) and effecting control so as to locate the position of the mask stage in accordance with the function Ls (x, y), whereby it is possible to suppress any overlay shift of the pattern from a reference position on the mask.

According to the light exposure tool of the present invention, as set out above, it is possible to improve an overlay accuracy of the light exposure pattern, or to suppress any overlay shift of the pattern from a reference position by, in order to correct the intrafield systematic errors depending upon the position of the wafer stage, finding n-th order components of at least one of intrafield errors relating to the interfield coordinate (x, y), that is, the at least one of the intrafield errors (θs(x,y), Mx(x,y), My(x,y) and θso(x,y)).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An exposure tool comprising:
   a wafer stage having a semiconductor wafer with a plurality of alignment marks formed thereon for position identification;
   a wafer stage position measuring mechanism for measuring a position of the wafer stage;
   a projection optical mechanism for projecting a circuit pattern onto the wafer to expose a predetermined area of the wafer with beam;
   an alignment mechanism for detecting the positions of wafer in an aligned state;
   a calculation mechanism for calculation-processing a signal obtained by processing an alignment output signal from the alignment mechanism and output signals obtained wafer stage position measuring mechanism; and
   a control mechanism which, at a plurality of exposures of the wafer by the projection optical mechanism, controls the alignment mechanism in accordance with an n-th order function (x, y) in an interfield coordinate (x, y) of the wafer by approximating a per-exposure systematic error of at least one of a shot rotation error, magnification error and skew error with the n-th order function Ls (x, y) and corrects the per-exposure systematic error depending upon the interfield coordinate.

2. The exposure tool according to claim 1, wherein the exposure tool is of a step and repeat type.

3. The exposure tool according to claim 1, wherein the exposure tool is of a step and scan type.

4. The exposure tool according to claim 1, wherein the beam of the exposure tool is electronic beam.

5. The exposure tool according to claim 1, wherein the beam of the exposure tool is laser beam.

6. The exposure tool according to claim 1, wherein the control mechanism includes a rotation adjusting mechanism for adjusting a stage in-plane rotation position of wafer stage.

7. The exposure tool according to claim 6, wherein the rotation adjusting mechanism includes a wafer stage rotation drive mechanism for driving the wafer stage in a rotation direction.

8. The exposure tool according to claim 1, wherein the control mechanism includes an isotropic magnification adjusting mechanism for adjusting an isotropic magnification of a wafer area projected with the beam.

9. The exposure tool according to claim 1, wherein the control mechanism includes a rotation adjusting mechanism for adjusting a stage in-plane rotation position of wafer stage and an isotropic magnification adjusting mechanism for adjusting an isotropic magnification of wafer area projected with the beam.

10. The exposure tool according to any one of claims 1, 6, 8 or 9, wherein the control mechanism includes a wafer XY stage drive mechanism for driving the wafer stage.

11. The exposure tool according to any one of claims 1, 6, 8 or 9, wherein the control mechanism includes a wafer XY stage drive mechanism for moving the wafer stage, the wafer XY stage drive mechanism being variable movement speeds.

12. The exposure tool according to claim 1, wherein the function Ls (x, y) with which the systematic error is approximated is found from the calculation mechanism.

13. The exposure tool according to claim 1, wherein the function Ls (x, y) with which the systematic error is approximated is found from an outside of the exposure tool.

14. A light exposure tool comprising:
   a reticle stage having a reticle placed thereon, the reticle having a circuit pattern written thereon and a plurality of alignment marks formed thereon;
   a wafer stage having a semiconductor wafer with a plurality of alignment marks formed thereon for position identification;
   a reticle stage position measuring mechanism for measuring a position of the reticle stage;
   a wafer stage position measuring mechanism for measuring a position of the wafer stage;
   a projection optical mechanism for projecting a circuit pattern of the reticle onto the wafer to expose a predetermined area of the wafer with light;

an alignment mechanism for detecting the positions of alignment marks on the reticle and on the wafer and setting the reticle and wafer in an aligned state;

a calculation mechanism for calculation-processing a signal obtained by processing an alignment output signal from the alignment mechanism and output signals obtained from the reticle stage position measuring mechanism and wafer stage position measuring mechanism; and a control mechanism which, at a plurality of exposures of the wafer by the projection optical mechanism, controls the alignment mechanism in accordance with an n-th order function (x, y) in an interfield coordinate (x, y) of the wafer by approximating a per-exposure systematic error of at least one of a shot rotation error, magnification error and skew error with the n-th order function Ls (x, y) and corrects the per-exposure systematic error depending upon the interfield coordinate.

15. The light exposure tool according to claim 14, wherein the light exposure tool is of a step and repeat type.

16. The light exposure tool according to claim 14, wherein the light exposure tool is of a step and scan type.

17. The light exposure tool according to claim 14, wherein the control mechanism includes a rotation adjusting mechanism for adjusting a stage in-plane rotation position of at least one of the reticle stage and wafer stage.

18. The light exposure tool according to claim 17, wherein the rotation adjusting mechanism includes a reticle stage rotation drive mechanism for driving the reticle stage in a rotation direction and a wafer stage rotation drive mechanism for driving the wafer stage in a rotation direction.

19. The light exposure tool according to claim 14, wherein the control mechanism includes an isotropic magnification adjusting mechanism for adjusting an isotropic magnification of a wafer area projected with the exposure light.

20. The light exposure tool according to claim 14, wherein the control mechanism includes a rotation adjusting mechanism for adjusting a stage in-plane rotation position of at least one of the reticle stage and wafer stage and an isotropic magnification adjusting mechanism for adjusting an isotropic magnification of wafer area projected with the exposure light.

21. The light exposure tool according to any of claims 14, 17, 19 or 20, wherein the control mechanism includes a reticle XY stage drive mechanism for driving the reticle stage.

22. The light exposure tool according to any one of claims 14, 17, 19 or 20, wherein the control mechanism includes a wafer XY stage drive mechanism for driving the wafer stage.

23. The light exposure tool according to any one of claims 14, 17, 19 or 20, wherein the control mechanism includes a reticle XY stage drive mechanism for moving the reticle stage and a wafer XY stage drive mechanism for moving the wafer stage, the reticle XY stage drive mechanism and wafer XY stage drive mechanism being variable in relative movement speeds.

24. The light exposure tool according to claim 14, wherein the function Ls (x, y) with which the systematic error is approximated is found from the calculation mechanism.

25. The light exposure tool according to claim 14, wherein the function Ls (x, y) with which the systematic error is approximated is found from an outside of the light exposure tool.

26. A light exposure tool comprising:

a reticle having a circuit pattern written thereon and a plurality of alignment marks formed thereon for position identification;

a reticle stage with the reticle placed thereon;

a reticle XY stage drive mechanism for driving the reticle stage in a translate direction;

a wafer stage having a semiconductor wafer with a plurality of alignment marks formed thereon for position identification;

a wafer XY stage drive mechanism for driving the wafer stage in a translate direction;

a shot rotation adjusting mechanism for adjusting a stage in-plane rotation position of at least one of the reticle stage and wafer stage;

a reticle stage position measuring mechanism for measuring a position of the reticle stage;

a wafer stage position measuring mechanism for measuring a position of the wafer stage;

a projection optical mechanism for projecting a circuit pattern of the reticle onto the wafer to create a shot;

an alignment mechanism for detecting a position on the reticle and on the wafer and setting the reticle and wafer in an aligned position;

a calculation mechanism for calculation-processing a signal obtained by processing an alignment output signal from the alignment mechanism and output signals obtained from the reticle stage position measuring mechanism and wafer stage position measuring mechanism; and correcting means for finding a shot rotation error $\theta$ at each of a plurality of shots on the wafer, approximating the rotation error $\theta$ with an n-th order function $\theta s$ (x, y) in an interfield coordinate (x, y) of the wafer, and controlling the shot rotation adjusting mechanism in accordance with the function $\theta s$ (x, y), thereby adjusting a stage in-plane rotation position of at least one of the reticle stage and wafer stage.

27. The light exposure tool according to claim 26, wherein the shot rotation adjusting mechanism includes a reticle stage rotation drive mechanism for driving the reticle stage in a rotation direction and a wafer stage rotation drive mechanism for driving the wafer stage in a rotation direction.

28. A light exposure tool comprising:

a reticle having a circuit pattern written thereon;

a reticle stage having the reticle placed thereon;

a reticle XY stage drive mechanism for driving the reticle stage in a translate direction;

a wafer stage having a semiconductor wafer placed thereon;

a wafer XY stage drive mechanism for driving the wafer stage in a translate direction;

a reticle stage position measuring mechanism for measuring a position of the reticle stage;

a wafer stage position measuring mechanism for measuring a position of the wafer stage;

a projection optical mechanism for projecting the circuit pattern of the reticle onto the wafer to create a shot;

an isotropic magnification adjusting mechanism for adjusting an isotropic magnification of a shot projected onto the wafer;

an alignment mechanism for detecting positions of a plurality of alignment marks formed on the reticle and on the wafer for position identification and setting the reticle and wafer in a desired position;

a calculation mechanism for calculation-processing a signal obtained by processing an alignment output signal from the alignment mechanism and output signals obtained from the reticle stage position measuring mechanism and wafer stage position measuring mechanism; and correcting means for adjusting the isotropic magnification of the shot by finding a magnification error M at each of a plurality of shots created on the wafer, approximating the magnification error M with an n-th order function M (x, y) in an interfield of the wafer and controlling the isotropic magnification adjusting mechanism in accordance with the function M (x, Y).

29. A light exposure tool comprising:

a reticle having a circuit pattern written thereon;

a reticle stage having the reticle placed thereon;

a reticle XY stage drive mechanism for driving the reticle stage in a translate direction;

a wafer stage having a semiconductor wafer placed thereon;

a wafer stage drive mechanism for driving the wafer stage in a translate direction;

a shot rotation adjusting mechanism for adjusting a stage in-plane rotation position of at least one of the reticle stage and wafer stage;

a reticle stage position measuring mechanism for measuring the position of the reticle stage;

a wafer stage position measuring mechanism for measuring the wafer stage position;

a projection optical mechanism for projecting the circuit pattern of the reticle onto the wafer to create a shot;

an isotropic magnification adjusting mechanism for adjusting the isotropic magnification of the shot created on the projected wafer;

an alignment mechanism for detecting positions of a plurality of alignment marks formed on the reticle and on the wafer for position identification and setting the reticle and wafer in a desired position;

a calculation mechanism for calculation-processing a signal obtained by processing an alignment output signal from the alignment mechanism and output signals obtained from the reticle stage position measuring mechanism and wafer stage position measuring mechanism; and correcting means for, while adjusting a stage in-plane rotation position of at least one of the reticle stage and wafer stage in accordance with an n-th order function Ls (x, y) in an interfield coordinate (x, y) of the wafer, correcting an isotropic magnification of the shot by finding a shot rotation error and magnification error at each of a plurality of shots created on the wafer, approximating the shot rotation error and magnification error with the n-th order function Ls (x, y) in the interfield coordinate (x, y) of the wafer and controlling the shot rotation adjusting mechanism and isotropic magnification adjusting mechanism in accordance with the function Ls (x, y).

30. A scan type light exposure tool for effecting light exposure under relative movement of a reticle and wafer at a time of creating a shot by projecting, on a mask placed on a mask stage, a circuit pattern written on the reticle which is placed on a reticle stage, comprising:

a shot rotation correcting mechanism for correcting a rotation of a shot during light exposure; and correcting means for correcting a stage in-plane rotation position of at least one of the reticle stage and wafer stage by finding a shot rotation error at each of a plurality of shots created on the wafer, approximating the shot rotation error with an n-th order function θs (x, y) in an interfield coordinate (x, y) and controlling the shot rotation correcting mechanism in accordance with the function θs (x, y).

31. A scan-type light exposure tool for effecting light exposure under relative movement of a reticle and wafer at a time of creating a shot by projecting, on a mask placed on a mask stage, a circuit pattern written on the reticle which is placed on a reticle stage, comprising:

a shot magnification correcting mechanism for correcting a magnification of a shot during light exposure; and correcting means for correcting a shot magnification by finding a magnification error (Mx, My) at each of a plurality of shots created on the wafer, approximating the magnification error with an n-th order function (x, y) in an interfield coordinate (x, y) of the wafer and controlling the shot magnification correcting mechanism in accordance with the function M (x, y).

32. A scan type light exposure tool for effecting light exposure under relative movement of a reticle and wafer at a time of creating a shot by projecting, on a mask placed on a mask stage, a circuit pattern written on a reticle placed on a reticle stage, comprising:

a shot skew correcting mechanism for correcting a skew of a shot during light exposure; and correcting means for correcting the shot skew by finding a skew error θso at each of a plurality of shots on the wafer, approximating the skew error with an n-th order function θso (x, y) in an interfield coordinate (x, y) of the wafer and controlling the shot skew correcting mechanism.

33. A scan type light exposure tool for effecting light exposure under relative movement of a reticle and wafer at a time of creating a shot by projecting, on a mask placed on a mask stage, a circuit pattern written on a reticle which is placed on a reticle stage, comprising:

a correcting mechanism for correcting shot rotation, magnification and skew errors of a shot during light exposure; and correcting means for correcting shot rotation, magnification and skew errors at each of a plurality of shots created on the wafer by finding a rotation error θs, magnification error (Mx, My) and skew error θso at each shot, approximating an n-th order function Ls (x, y) in an interfield coordinate of the wafer and controlling the correcting mechanism in accordance with the function Ls (x, y).

34. A mask pattern light exposure tool for exposing, with light, a circuit pattern on a mask placed on a mask stage, comprising:

a correction mechanism for correcting at least one of a shot rotation (θs), shot magnification (Mx+My) and shot skew (θso) upon exposing the mask with the light; and control means for effecting control by finding at least one of systematic errors (θs, Mx, My, θso) at each of a plurality of shots created on the mask, approximating, with an n-th order function Ls (x, y) in a coordinate (x, y) in a mask plane, at least one of a shot rotation error, magnification error and skew error and positioning the mask stage in accordance with the function Ls (x, y).

35. A method for writing a circuit pattern with an exposure tool for writing a circuit pattern by a beam on a semiconductor wafer placed on a wafer stage comprising the steps of:

effecting calculation-processing by finding at least one of systematic errors Ls (θs, Mx, My θso) at each of a plurality of shots created on the wafer and approximating at least one of a shot rotation error, magnification error and skew error with an n-th order function Ls (x, y) in an interfield coordinate (x, y) of the wafer; and effecting control by correcting at least one of a shot rotation (θs), shot magnification (Mx, My) and shot skew (θso), during the writing of the circuit pattern on the wafer, in accordance with the function Ls (x, y).

36. A method for effecting light exposure with a light exposure tool for projecting, on a semiconductor wafer placed on a wafer stage, a circuit pattern written on a reticle which is placed on a reticle stage, comprising the steps of:

effecting calculation-processing by approximating a per-exposure systematic error consisting of at least one of a shot rotation error, magnification error and skew error at a plurality of light exposures of the wafer with an n-th order function Ls (x, y) in an interfield coordinate (x, y) of the wafer; and effecting control by adjusting a position in a stage plane of at least one of the reticle stage and wafer stage in accordance with the function Ls (x, y).

37. The method according to claim 36, wherein the method is used on a step and repeat type light exposure tool.

38. The method according to claim 36, wherein the method is used on a step and scan type light exposure tool.

39. The method according to claim 36, wherein the calculation step is done in a light exposure tool.

40. The method according to claim 36, wherein the calculation step is done outside a light exposure tool.

41. A method for effecting light exposure on a light exposure tool for creating a shot by projecting, on a semiconductor wafer placed on a wafer stage, a circuit pattern written on a reticle which is placed on a reticle stage, comprising:

effecting calculation-processing by finding a shot rotation error θ at each of a plurality of shots created on the wafer and approximating the shot rotation error θ with an n-th order function θs (x, y) in an interfield coordinate (x, y) of the wafer; and effecting control by adjusting a rotation position in a stage plane of at least one of the reticle stage and wafer stage in accordance with the function θs (x, y).

42. A method for effecting light exposure on a light exposure tool for creating a shot by projecting, on a semiconductor wafer placed on a wafer stage, a circuit pattern written on a reticle which is placed on a reticle stage, comprising:

effecting calculation-processing by finding a magnification error θ at each of a plurality of shots created on the wafer and approximating the magnification error θ with an n-th order function θs (x, y) in an interfield coordinate (x, y) of the wafer; and effecting control by adjusting an isotropic magnification of the shot in accordance with the function θs (x, y).

43. A method for effecting light exposure on a light exposure tool for creating a shot by projecting, on a semiconductor wafer placed on a wafer stage, a circuit pattern written on a reticle which is placed on a reticle stage, comprising:

effecting calculation processing by finding a rotation error and magnification error at each of a plurality of shots created on the wafer and approximating the shot rotation error and magnification error with an n-th order function Ls (x, y) in an interfield coordinate (x, y) of the wafer; and effecting control by adjusting an isotropic magnification of the shot while adjusting a shot rotation position in a stage plane of at least one of the reticle stage and wafer stage in accordance with the function Ls (x, y).

44. A method for effecting light exposure on a light exposure tool for creating a shot by projecting, on a semiconductor wafer placed on a wafer stage, a circuit pattern written on a reticle which is placed on a reticle stage, comprising:

effecting calculation-processing by measuring, by an alignment mechanism, at least one of a shot rotation error θs (x, y), shot magnification error (Mx, My) and shot skew errors θs (x, y) at a plurality of shots created on a wafer with respect to a predetermined specific wafer and approximating a measurement error with an n-th order function Ls (x, y) in an interfield coordinate (x, y) of the wafer; and effecting control by, after adjusting at least one of the shot rotation error, magnification error and skew error in accordance with the function Ls (x, y), sequentially exposing the specific wafer and other wafers.

45. A method for exposing, with light, a circuit pattern on a mask placed on a mask stage, comprising the steps of:

effecting calculation-processing by finding at least one of systematic errors Ls (θs, Mx, My, θso) at each of a plurality of shots created on the mask and approximating at least one of a shot rotation error, magnification error and skew error with an n-th order function Ls (x, y) in a coordinate (x, y) in a mask plane; and effecting control by correcting at least one of a shot rotation (θs), shot magnification (Mx, My) and shot skew (θso), a during the exposure of the mask with the light, in accordance with the function Ls (x, y).

46. A method for writing a circuit pattern with an electronic beam exposure tool for writing a circuit pattern by an electronic beam on a semiconductor wafer placed on a wafer stage, comprising the steps of:

effecting calculation-processing by finding at least one of systematic errors Ls (θs, Mx, My, θso) at each of a plurality of shots created on the wafer and approximating at least one of a shot rotation error, magnification error and skew error with an n-th order function Ls (x, y) in an interfield coordinate (x, y) of the wafer; and effecting control by correcting at least one of a shot rotation (θs), shot magnification (Mx, My) and shot skew (θso), during the writing of the circuit pattern on the wafer, in accordance with the function Ls (x, y).

47. The method according to claim 46, wherein the systematic errors Ls are initially found by a measuring machine outside the exposure tool.

* * * * *

UNITED STATES PATENT AND TRADEMARK OFFICE
CERTIFICATE OF CORRECTION

PATENT NO. : 6,008,880
DATED : December 28, 1999
INVENTOR : Tatsuhiko HIGASHIKI et al.

It is certified that error appears in the above-identified patent and that said Letters Patent is hereby corrected as shown below:

Claim 28, Column 13, line 11, "(x,Y)", should read --(x,y)--.

Claim 45, Column 16, line 40, before "during", delete "a".

Signed and Sealed this

Twenty-seventh Day of March, 2001

*Attest:*

NICHOLAS P. GODICI

*Attesting Officer*   *Acting Director of the United States Patent and Trademark Office*